United States Patent
Hong et al.

(10) Patent No.: US 9,142,489 B2
(45) Date of Patent: Sep. 22, 2015

(54) SEMICONDUCTOR DEVICES INCLUDING A NON-PLANAR CONDUCTIVE PATTERN, AND METHODS OF FORMING SEMICONDUCTOR DEVICES INCLUDING A NON-PLANAR CONDUCTIVE PATTERN

(71) Applicant: Samsung Electronics Co., Ltd., Suwon-si (KR)

(72) Inventors: Jongwon Hong, Hwaseong-si (KR); Hei Seung Kim, Suwon-si (KR); Kyoung Hee Nam, Seoul (KR); Jongmyeong Lee, Seongnam-si (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 13/962,341

(22) Filed: Aug. 8, 2013

(65) Prior Publication Data
US 2014/0042633 A1 Feb. 13, 2014

(30) Foreign Application Priority Data
Aug. 10, 2012 (KR) ........................ 10-2012-0087828

(51) Int. Cl.
*H01L 23/48* (2006.01)
*H01L 23/00* (2006.01)

(52) U.S. Cl.
CPC .............. *H01L 23/481* (2013.01); *H01L 24/03* (2013.01); *H01L 24/05* (2013.01); *H01L 24/48* (2013.01); *H01L 24/11* (2013.01); *H01L 24/13* (2013.01); *H01L 24/45* (2013.01); *H01L 2224/036* (2013.01); *H01L 2224/0345* (2013.01); *H01L 2224/0346* (2013.01); *H01L 2224/0391* (2013.01); *H01L 2224/0401* (2013.01); *H01L 2224/04042* (2013.01); *H01L 2224/05093* (2013.01); *H01L 2224/05548* (2013.01); *H01L 2224/05557* (2013.01); *H01L 2224/05558* (2013.01); *H01L 2224/1146* (2013.01); *H01L 2224/11334* (2013.01); *H01L 2224/131* (2013.01); *H01L 2224/13022* (2013.01); *H01L 2224/13144* (2013.01); *H01L 2224/45144* (2013.01); *H01L 2224/48091* (2013.01); *H01L 2224/48228* (2013.01); *H01L 2224/48453* (2013.01); *H01L 2224/48464* (2013.01)

(58) Field of Classification Search
CPC .............. H01L 2924/014; H01L 2224/12105; H01L 24/14; H01L 24/17; H01L 2924/01029; H01L 2933/0066; H01L 33/54; H01L 33/62
See application file for complete search history.

(56) References Cited

U.S. PATENT DOCUMENTS 5,696,406 A    12/1997 Ueno
(Continued)

FOREIGN PATENT DOCUMENTS

JP    05-347358    12/1993
JP    2003-324122    11/2003
(Continued)

*Primary Examiner* — Jaehwan Oh
(74) *Attorney, Agent, or Firm* — Myers Bigel Sibley & Sajovec, PA

(57) ABSTRACT

Semiconductor devices are provided. The semiconductor devices may include a non-planar conductive pattern. The non-planar conductive pattern may be on an insulating layer and may contact a connection terminal at a plurality of different heights. Related methods of forming semiconductor devices are also provided.

19 Claims, 20 Drawing Sheets

(56) References Cited

U.S. PATENT DOCUMENTS

| | | |
|---|---|---|
| 6,560,862 B1 * | 5/2003 | Chen et al. ............... 29/843 |
| 6,888,258 B2 * | 5/2005 | Matsuoka et al. ......... 257/784 |
| 7,211,902 B2 | 5/2007 | Yamaha |
| 8,178,980 B2 | 5/2012 | Jeng et al. |
| 2006/0138662 A1 * | 6/2006 | Yamaha .................... 257/758 |

FOREIGN PATENT DOCUMENTS

| | | |
|---|---|---|
| JP | 2004-158679 | 6/2004 |
| JP | 3595771 B2 | 12/2004 |
| JP | 2005-142252 | 6/2005 |
| JP | 2005-166804 | 6/2005 |
| KR | 1020020059952 A | 7/2002 |

* cited by examiner

SEMICONDUCTOR DEVICES INCLUDING A NON-PLANAR CONDUCTIVE PATTERN, AND METHODS OF FORMING SEMICONDUCTOR DEVICES INCLUDING A NON-PLANAR CONDUCTIVE PATTERN

CROSS-REFERENCE TO RELATED APPLICATION

This U.S. non-provisional patent application claims priority under 35 U.S.C. §119 to Korean Patent Application No. 10-2012-0087828, filed on Aug. 10, 2012, in the Korean Intellectual Property Office, the disclosure of which is hereby incorporated herein by reference in its entirety.

BACKGROUND

The present disclosure relates to semiconductor devices and methods of forming semiconductor devices. A wire bonding technique and a flip-chip bonding technique may be used in a process of packaging a semiconductor chip on a package substrate. In the wire bonding technique, gold balls may be attached on bonding pads of the semiconductor chip, and may be elongated to form gold wires to be connected to conductive patterns of the package substrate. In the flip-chip bonding technique, bumps may be formed on the bonding pads of the semiconductor chip, and may be connected to the conductive patterns of the package substrate. Moreover, as the integration density of semiconductor devices increases, the area of individual bonding pads may decrease. Accordingly, there may be an increased risk of failure in a packaging process in which a semiconductor chip is packaged using the wire bonding technique or the flip-chip bonding technique.

SUMMARY

Various embodiments of the present inventive concepts provide a semiconductor device. The semiconductor device may include a substrate including first and second regions. The semiconductor device may include an insulating layer on the substrate. The semiconductor device may include first and second conductive patterns on the insulating layer, and on respective ones of the first and second regions. Moreover, the semiconductor device may include a connection terminal on the second conductive pattern. The first conductive pattern may include a substantially planar top surface. The second conductive pattern may include a non-planar top surface contacting the connection terminal at a plurality of different heights.

In various embodiments, the semiconductor device may include first and second recess regions in the insulating layer on the first and second regions, respectively. Moreover, the semiconductor device may include third and fourth conductive patterns in the first and second recess regions, respectively, which third and fourth conductive patterns may be configured to be electrically connected to the first and second conductive patterns, respectively.

According to various embodiments, the semiconductor device may include a diffusion barrier layer in the second recess region and between the fourth conductive pattern and the insulating layer. The fourth conductive pattern may include a top surface that is lower than a top surface of the insulating layer. The diffusion barrier layer may extend along a sidewall of the second recess region and may contact the second conductive pattern in the second recess region. Additionally or alternatively, the semiconductor device may include a seed layer between the diffusion barrier layer and the fourth conductive pattern, which seed layer may extend along a sidewall and may contact the second conductive pattern in the second recess region.

In various embodiments, the fourth conductive pattern may include portions on side and bottom surfaces of the second recess region. Moreover, the fourth conductive pattern may include a first thickness on the bottom surface of the second recess region that is thicker than a second thickness on the side surface of the second recess region.

According to various embodiments, the third and fourth conductive patterns may include respective top surfaces that are lower than a top surface of the insulating layer. Also, the semiconductor device may include a fifth conductive pattern in the first recess region and between the first and third conductive patterns, as well as a sixth conductive pattern in the second recess region and between the second and fourth conductive patterns. The sixth conductive pattern may include portions conformally on side and bottom surfaces of the second recess region.

In various embodiments, the second recess region may include a first width that is wider than a second width of the first recess region. Additionally or alternatively, the second conductive pattern may be a bonding pad.

A method of forming a semiconductor device, according to various embodiments, may include forming an insulating layer on a substrate including first and second regions. The method may include patterning the insulating layer to form first and second recess regions on the first and second regions, respectively. The method may include forming first and second conductive patterns, the first conductive pattern in the first recess region and the second conductive pattern on a bottom surface of the second recess region and partially filling the second recess region. Moreover, the method may include forming third and fourth conductive patterns on the first and second conductive patterns, respectively. The fourth conductive pattern may include a non-planar top surface.

In various embodiments, the method may include forming a connection terminal contacting the non-planar top surface of the fourth conductive pattern at a plurality of different heights. Also, forming the fourth conductive pattern may include forming the fourth conductive pattern in the second recess region on the second conductive pattern, as well as forming the fourth conductive pattern outside of the second recess region on the insulating layer.

According to various embodiments, forming the first and second conductive patterns may include depositing a conductive layer using physical vapor deposition or a sputtering process, as well as performing a thermal treatment to reflow the conductive layer. Performing the thermal treatment may include performing the thermal treatment at a temperature ranging from about 150° C. to about 400° C. Additionally or alternatively, forming the first and second conductive patterns may include performing a plating process to form a plating layer, after performing the thermal treatment. In some embodiments, the method may include conformally forming a diffusion barrier layer on the insulating layer, before forming the first and second conductive patterns. Moreover, in some embodiments, forming the first and second conductive patterns may include performing a planarization etching process to remove the diffusion barrier layer and the conductive layer from a top surface of the insulating layer.

A semiconductor device, according to various embodiments, may include an insulating layer on a substrate, where the insulating layer may include a recess therein. The semiconductor device may include a non-planar conductive pattern including a first portion on the insulating layer and a second portion in the recess. The semiconductor device may include a connection terminal including first and second portions on respective ones of the first and second portions of the non-planar conductive pattern.

In various embodiments, the first portion of the connection terminal may contact the first portion of the non-planar conductive pattern at a first height. Moreover, the second portion of the connection terminal may contact the second portion of the non-planar conductive pattern at a second height that is different from the first height. The second portion of the connection terminal may contact the second portion of the non-planar conductive pattern in the recess of the insulating layer.

According to various embodiments, the substrate may include first and second regions. The non-planar conductive pattern may be on the second region, and the semiconductor device may include a substantially planar conductive pattern on the first region. Additionally or alternatively, the non-planar conductive pattern may include a first conductive pattern in the recess, and the semiconductor device may include a second conductive pattern in the recess and between the first conductive pattern and the substrate.

BRIEF DESCRIPTION OF THE DRAWINGS

The above and other features and advantages of the disclosure will become more apparent in view of the attached drawings and accompanying detailed description.

DETAILED DESCRIPTION

Figure 1:
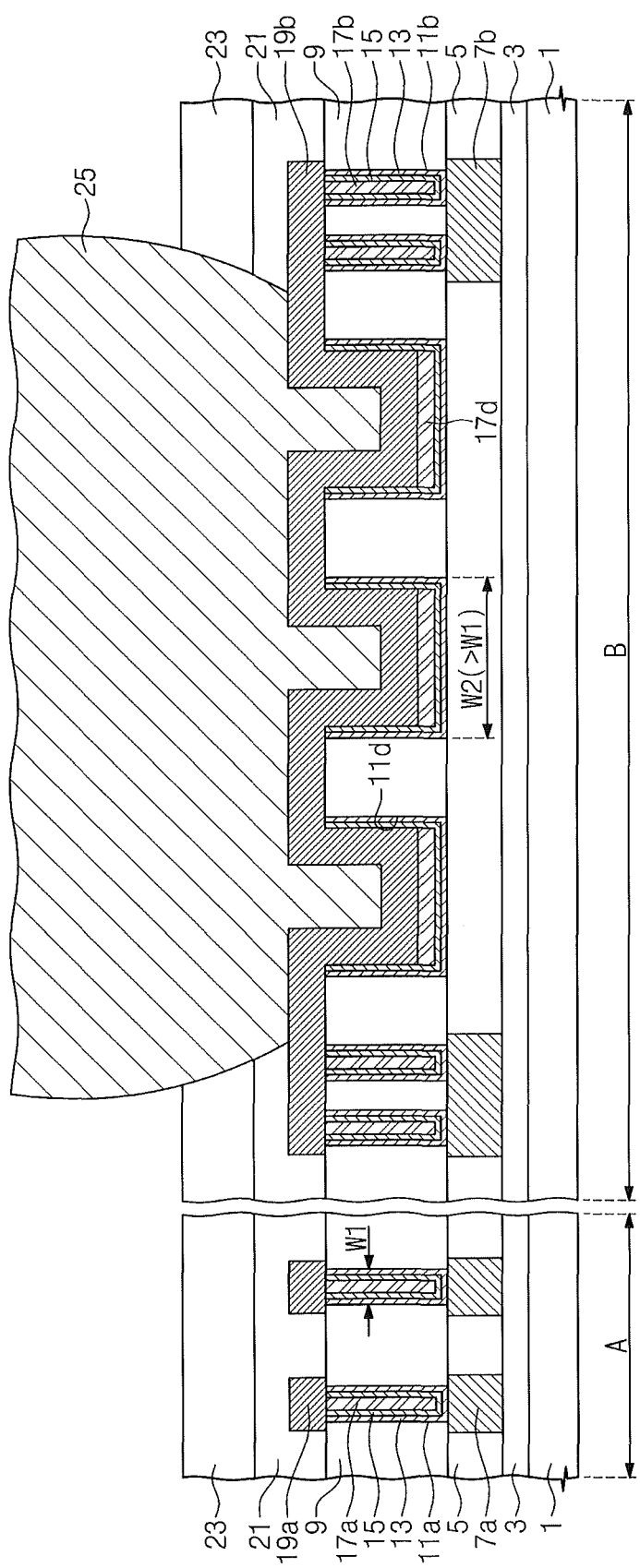
FIG. 1 is a sectional view illustrating a semiconductor device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a sectional view illustrating a semiconductor device according to some embodiments. Referring to FIG. 1, a semiconductor device may include a substrate 1 with a first region A and a second region B. In some embodiments, patterns for a cell array region or a peripheral circuit region may be provided on the first region A, and bonding pads may be provided on the second region B. The substrate 1 may be a semiconductor wafer or a substrate including a semiconductor epitaxial layer. A first insulating layer 3 may be provided on the substrate 1. The first insulating layer 3 may be an interlayer insulating layer or an etch-stop layer. A device isolation layer and transistors may be provided on the substrate 1. In addition, interconnection wires or contact or via plugs may be provided in the first insulating layer 3. The first insulating layer 3 may be formed of a silicon oxide layer, a silicon nitride layer, or a silicon oxide layer.

First conductive patterns 7a and second conductive patterns 7b may be provided on the first and second regions A and B, respectively, which may be covered with the first insulating layer 3. The first conductive pattern 7a and the second conductive pattern 7b may be electrically connected to interconnection wires or contact or via plugs. A space between the first and second conductive patterns 7a and 7b may be filled with a second insulating layer 5. The first and second conductive patterns 7a and 7b may be formed of the same material. In some embodiments, the first and second conductive patterns 7a and 7b may be formed of a metal layer (e.g., copper, aluminum, or tungsten). The second insulating layer 5 may be formed of a silicon oxide layer, a silicon nitride layer, or a silicon oxynitride layer.

A third insulating layer 9 may be provided on the second insulating layer 5. The third insulating layer 9 may be formed of a silicon oxide layer, a silicon nitride layer, or a silicon oxynitride layer. A first recess region 11a may be formed in the third insulating layer 9 on the first region A. A second recess region 11b and a dummy recess region 11d may be formed in the third insulating layer 9 on the second region B. A width W1 of the first recess region 11a may be equivalent or similar to that of the second recess region 11b. A width W2 of the dummy recess region 11d may be greater than the width W1 of the first recess region 11a. The first and second recess regions 11a and 11b may overlap the first and second conductive patterns 7a and 7b, respectively. The dummy recess region 11d may not overlap either of the first and second conductive patterns 7a and 7b.

Side and bottom surfaces of the recess regions 11a, 11b, and 11d may be sequentially covered with a diffusion barrier layer 13 and a seed layer 15. The diffusion barrier layer 13 may be formed of at least one of titanium, titanium nitride, tantalum, tantalum nitride, ruthenium, or cobalt. The seed layer 15 may be formed of at least one selected from the group consisting of copper, copper/aluminum, copper/manganese, ruthenium/tantalum, or ruthenium. The first and second recess regions 11a and 11b may have relatively narrow widths, and thus, the first and second recess regions 11a and 11b may be filled with third and fourth conductive patterns 17a and 17b, respectively. The dummy recess region 11d may have a relatively wide width, and thus, a dummy conductive pattern 17d may be provided on a bottom of the dummy recess region 11d. For example, the dummy conductive pattern 17d may be formed not to fill the dummy recess region 11d completely. The dummy conductive pattern 17d may have a top surface that is located below that of the third insulating layer 9. The third and fourth conductive patterns 17a and 17b may have top surfaces that are coplanar with that of the third insulating layer 9. The dummy conductive pattern 17d may be provided to have a predetermined thickness on the bottom portion of the dummy recess region 11d. The third, fourth, and dummy conductive patterns 17a, 17b, and 17d may be formed of the same material. For example, the third, fourth, and dummy conductive patterns 17a, 17b, and 17d may be formed of a metal material (e.g., of copper, tungsten, or aluminum).

In the first region A, a fifth conductive pattern 19a may be provided on the third insulating layer 9 to be in contact with the third conductive pattern 17a. In the second region B, a sixth conductive pattern 19b may be provided on the third insulating layer 9 to be in contact with both of the fourth conductive pattern 17b and the dummy conductive pattern 17d. The sixth conductive pattern 19b may be in contact with the seed layer 15 in the dummy recess region 11d. The sixth conductive pattern 19b may have a concavo-convex top surface, because the dummy conductive pattern 17d is formed to fill partially the dummy recess region 11d. The fifth and sixth conductive patterns 19a and 19b may be formed of the same material. The sixth conductive pattern 19b may serve as a bonding pad. The fourth conductive pattern 17b may connect the second conductive pattern 7b electrically with the sixth conductive pattern 19b. In some embodiments, due to the dummy recess region 11d and the dummy conductive pattern 17d, the sixth conductive pattern 19b may be formed to have the concavo-convex top surface.

A first passivation layer 21 and a second passivation layer 23 may be sequentially stacked on the third insulating layer 9. The first passivation layer 21 may be formed of, for example, a silicon nitride layer. The second passivation layer 23 may be formed of, for example, a polyimide layer. An external connection terminal 25 may be provided through the second and first passivation layers 23 and 21 to be in contact with the sixth conductive pattern 19b. The external connection terminal 25 may be a gold ball, a solder ball, or a bump.

Because the sixth conductive pattern 19b serving as a bonding pad has the concavo-convex top surface, it can be connected to the connection terminal 25 with an increased contact area and an increased attaching strength, which may improve the reliability of the semiconductor device.

Figure 2:
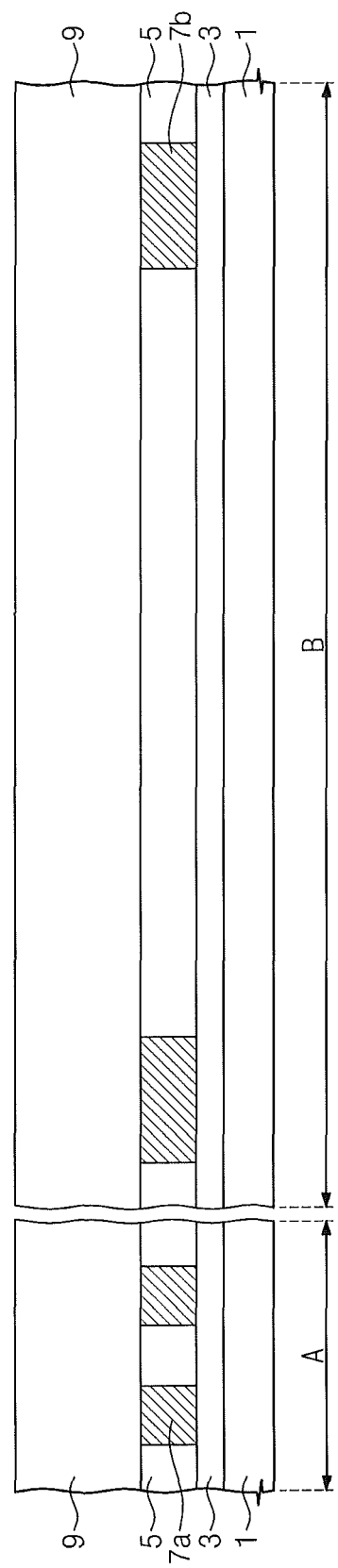
FIGS. 2 through 9 are sectional views illustrating a process of fabricating the semiconductor device of FIG. 1.

FIGS. 2 through 9 are sectional views illustrating a process of fabricating the semiconductor device of FIG. 1. Referring to FIG. 2, the first insulating layer 3 may be formed on the substrate 1 including the first region A and the second region B. The first insulating layer 3 may serve as an interlayer insulating layer or an etch stop layer. Before the formation of the first insulating layer 3, a device isolation layer and transistors may be formed on the substrate 1. Further, interconnection wires or contact or via plugs may be formed in the first insulating layer 3.

A conductive layer may be deposited on the first insulating layer 3, and may be patterned to form the first and second conductive patterns 7a and 7b on the first and second regions A and B, respectively. The second insulating layer 5 may be formed to fill a gap region between the first and second conductive patterns 7a and 7b, and then, may be etched using a planarization process to expose top surfaces of the first and second conductive patterns 7a and 7b. Alternatively, the first and second conductive patterns 7a and 7b may be formed using a damascene process. For example, the formation of the first and second conductive patterns 7a and 7b may include forming the second insulating layer 5 on the first insulating layer 3, patterning the second insulating layer 5 to form a trench, filling the trench with a conductive layer, and planarizing the conductive layer. The third insulating layer 9 may be formed on the second insulating layer 5.

Figure 3:
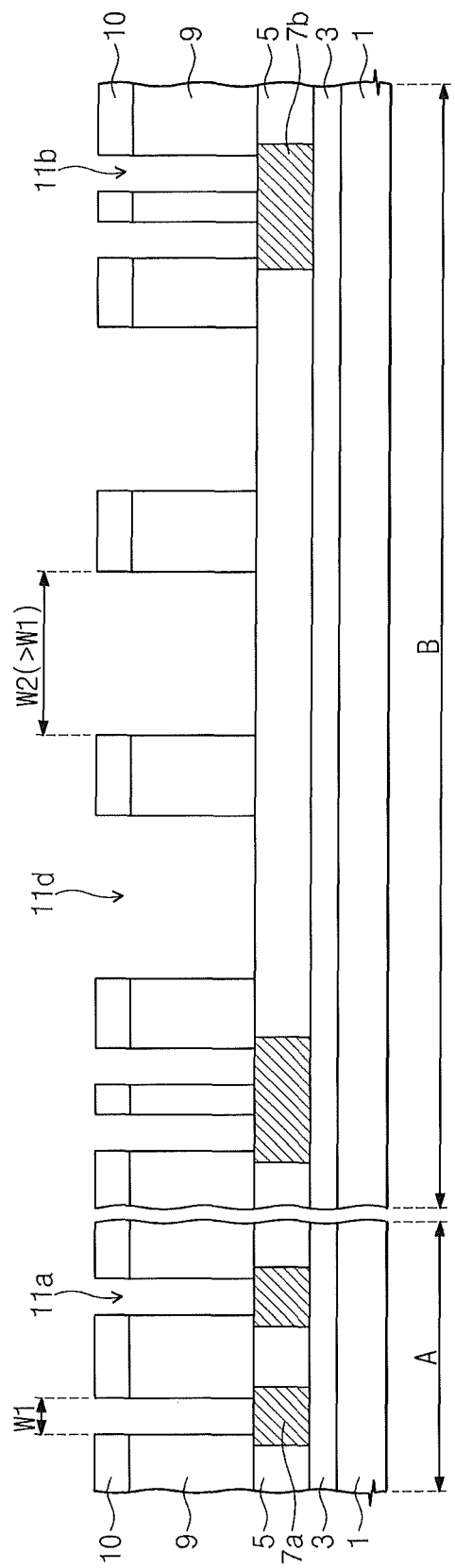

Referring to FIG. 3, a mask pattern 10 may be formed on the third insulating layer 9. The mask pattern 10 may be formed of at least one material having an etch selectivity with respect to the third insulating layer 9. For example, the mask pattern 10 may be a photoresist pattern. The third insulating layer 9 may be etched using the mask pattern 10 as an etch mask, to form the first recess region 11a on the first region A and to form the second recess region 11b and the dummy recess region 11d on the second region B. The first and second recess regions 11a and 11b may be formed to expose the first and second conductive patterns 7a and 7b, respectively. In some embodiments, the first and second recess regions 11a and 11b may be shaped like a hole or a groove. A width W1 of the first recess region 11a may be equivalent or similar to that of the second recess region 11b. A width W2 of the dummy recess region 11d may be greater than the width W1 of the first recess region 11a.

Figure 4:
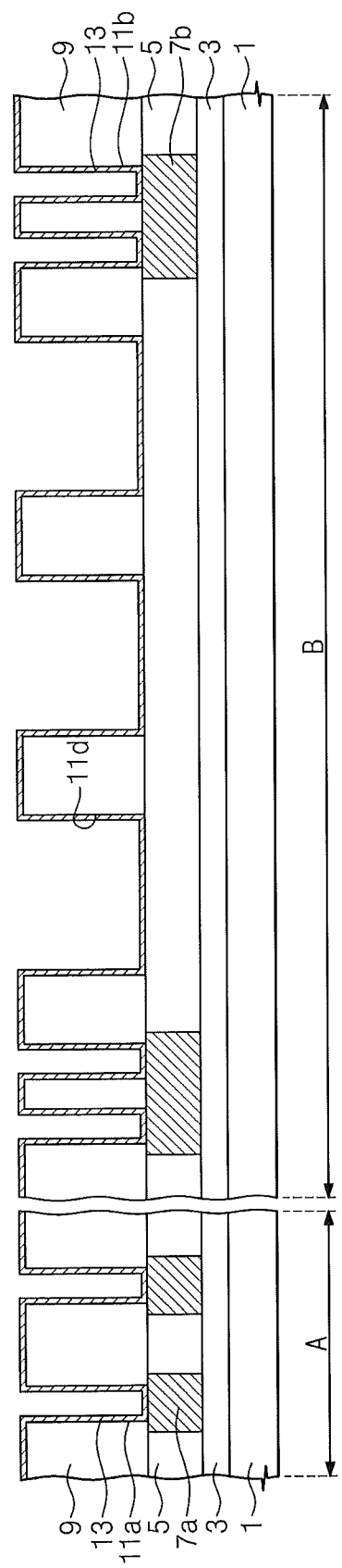

Referring to FIG. 4, the diffusion barrier layer 13 may be conformally formed on the substrate 1 having the first, second, and dummy recess regions 11a, 11b and 11d thereon. The diffusion barrier layer 13 may be formed of at least one of titanium, titanium nitride, tantalum, tantalum nitride, ruthenium, or cobalt. The diffusion barrier layer 13 may be formed using at least one of a chemical vapor deposition (CVD), an atomic layer deposition (ALD), or a sputtering process.

Figure 5:
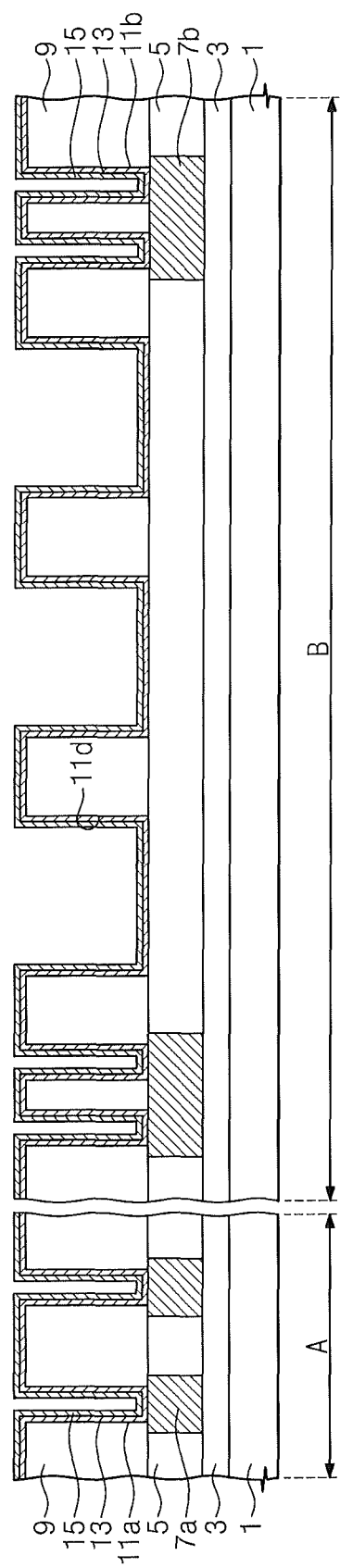

Referring to FIG. 5, the seed layer 15 may be conformally formed on the diffusion barrier layer 13. The seed layer 15 may be formed of at least one of copper, copper/aluminum, copper/manganese, ruthenium/tantalum, or ruthenium. The seed layer 15 may be formed using at least one of a chemical vapor deposition (CVD), an atomic layer deposition (ALD), or a sputtering process.

Figure 6:
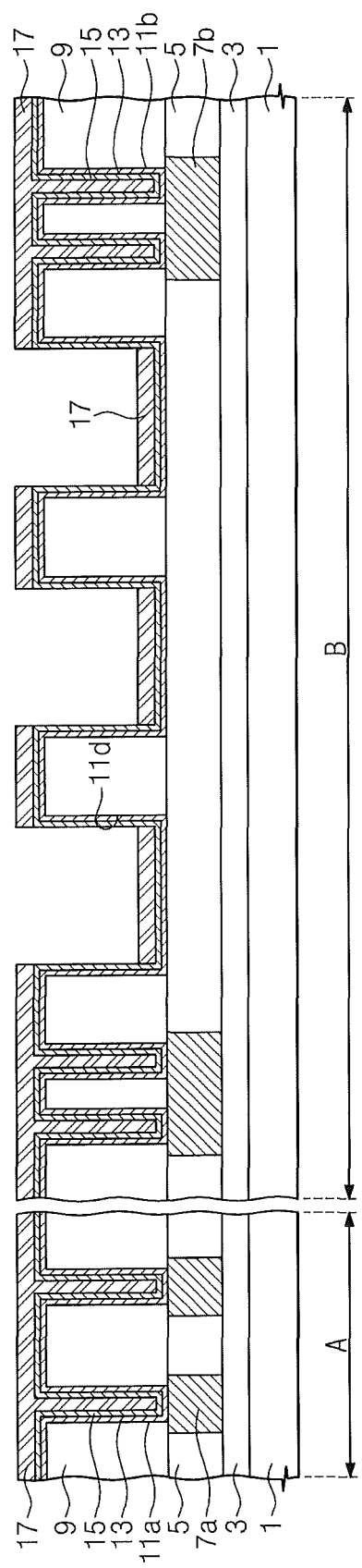

Referring to FIG. 6, a conductive layer 17 may be formed on the seed layer 15. The conductive layer 17 may be formed of at least one of copper, tungsten, or aluminum. The conductive layer 17 may be deposited using a Physical Vapor Deposition (PVD) or sputtering process, and then, may be thermally treated to be reflowed. The thermal treatment or the reflow process may be performed at a temperature ranging about from about 150° C. to about 400° C. In some embodiments, a process time of the PVD or sputtering process and/or a deposition thickness of the conductive layer 17 may be controlled in such a way that the conductive layer 17 is formed to fully fill the first and second recess regions 11a and 11b that have a relatively small width, but partially fill the dummy recess region 11d that has a relatively large width. If the conductive layer 17 is formed using the PVD or sputtering process, then it may be formed to be thicker on a bottom surface of the dummy recess region 11d than on a side surface of the dummy recess region 11d. Even when the conductive layer 17 is partially formed on a sidewall of the dummy recess region 11d, the conductive layer 17 may be reflowed downward along the sidewall of the dummy recess region 11d provided with the seed layer 15, during the thermal treatment, and may remain at a bottom of the dummy recess region 11d. A portion of the conductive layer 17 located on the third insulating layer 9 may also be reflowed downward along the sidewall of the dummy recess region 11d during the thermal treatment. As a result of the reflow process, the seed layer 15 may be exposed on the sidewall of the dummy recess region 11d. The seed layer 15 may be configured to contribute to the downward reflowing of the conductive layer 17.

Figure 7:
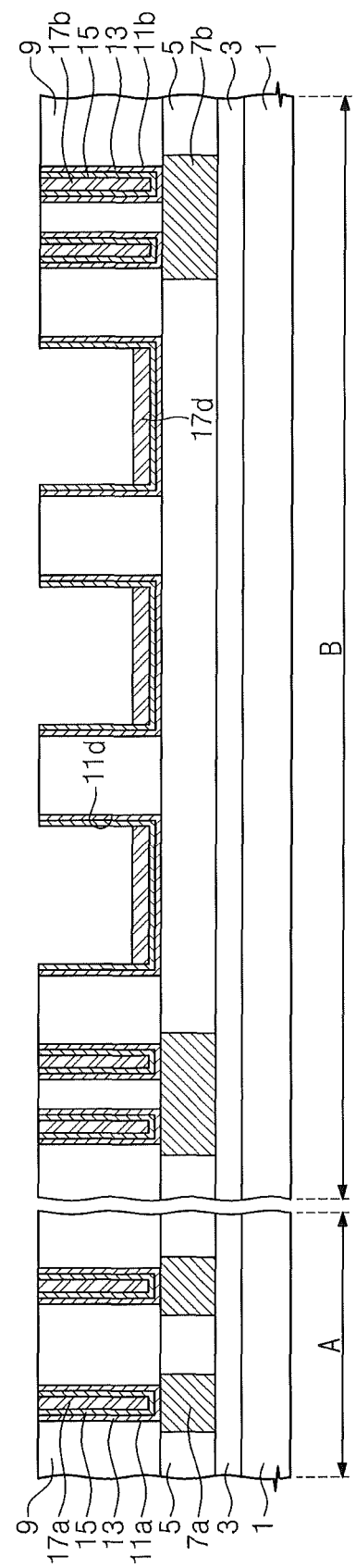

Referring to FIG. 7, a planarization etching process may be performed to remove the diffusion barrier layer 13, the seed layer 15, and the conductive layer 17 from a top surface of the third insulating layer 9. Accordingly, third and fourth conductive patterns 17a and 17b may be formed in the first and second recess regions 11a and 11b, respectively, and the dummy conductive pattern 17d may be formed in the dummy recess region 11d. The planarization etching process may be performed using an etch-back process or a chemical mechanical polishing (CMP) process. As a result, the third and fourth conductive patterns 17a and 17b may have top surfaces that are coplanar with that of the third insulating layer 9. The dummy conductive pattern 17d may cover a bottom surface of the dummy recess region 11d and may have a thickness smaller than a depth of the dummy recess region 11d. In comparison with forming the conductive layer 17 by another deposition process or a plating process, a thickness of the conductive layer 17 on the third insulating layer 9 may be thinner as a result of the reflowing of the conductive layer 17. This may reduce an amount of the conductive layer 17 that is needed to be removed in the planarization etching process, and thus, it may be possible to reduce a process time of the planarization etching process. In some embodiments, due to the presence of the dummy recess region 11d, it may be possible to prevent a dishing problem from occurring in the planarization etching process.

Figure 8:
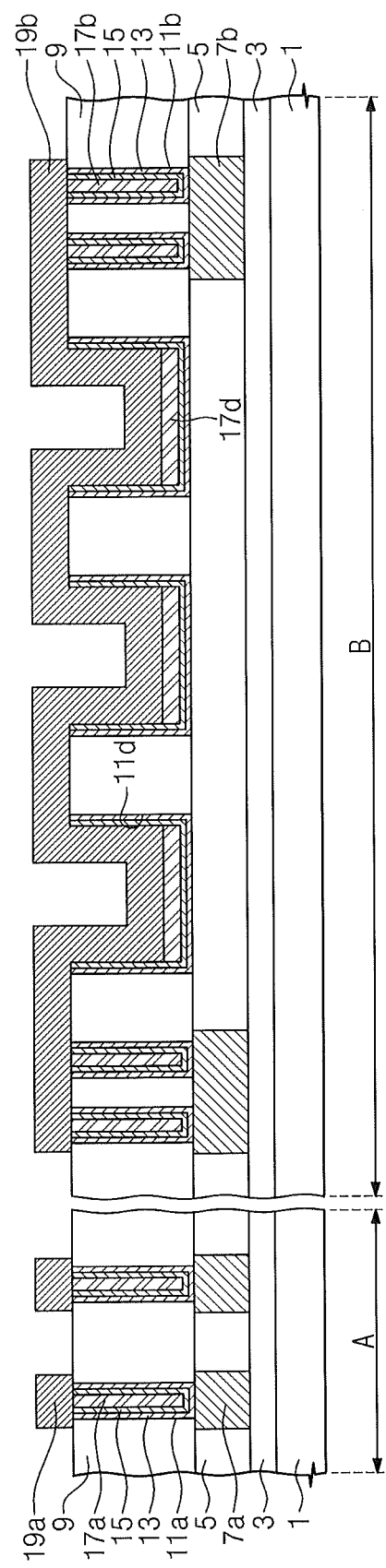

Referring to FIG. 8, a conductive layer may be conformally deposited on the substrate 1, and may be patterned to form the fifth conductive pattern 19a on the first region A and the sixth conductive pattern 19b on the second region B. In some embodiments, the fifth conductive pattern 19a may be formed to be in contact with the third conductive pattern 17a, and the sixth conductive pattern 19b may be formed to be in contact with both of the fourth conductive pattern 17b and the dummy conductive pattern 17d. The fifth and sixth conductive patterns 19a and 19b may be formed of, for example, aluminum. Because the dummy recess region 11d may not be completely filled with the dummy conductive pattern 17d, the sixth conductive pattern 19b may be formed to have a concavo-convex top surface.

Figure 9:
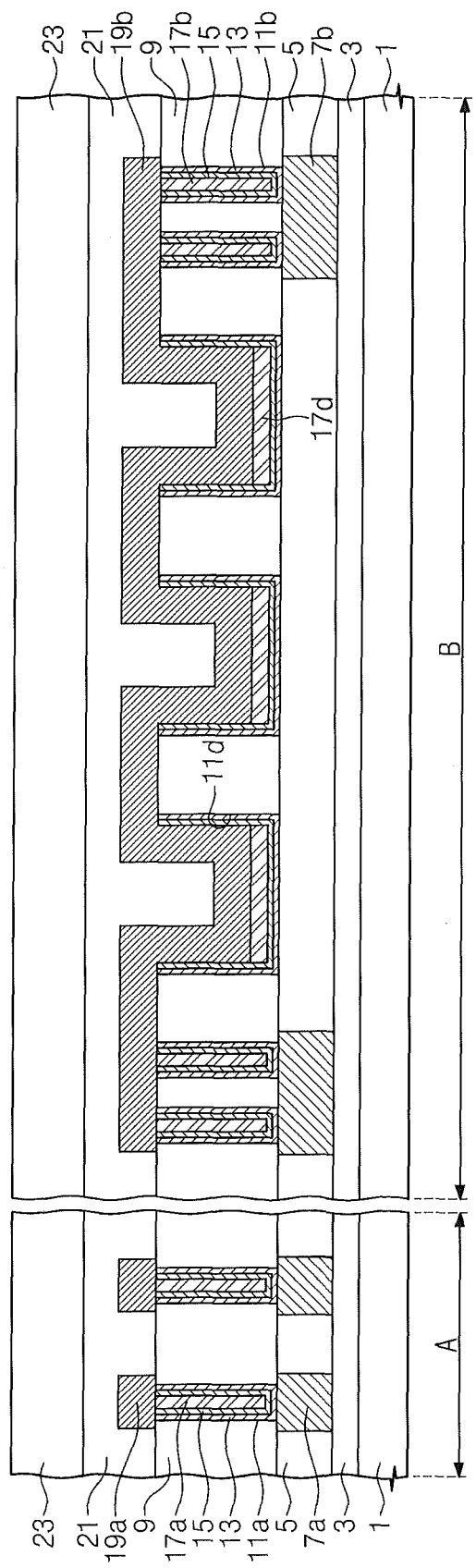

Referring to FIG. 9, the first passivation layer 21 and the second passivation layer 23 may be sequentially formed on the substrate 1. The first passivation layer 21 may be formed of, for example, a silicon nitride layer, and the second passivation layer 23 may be formed of, for example, a polyimide layer.

Thereafter, as shown in FIG. 1, the second passivation layer 23 and the first passivation layer 21 may be sequentially patterned to form an opening exposing the sixth conductive pattern 19b. Next, connection terminals 25 may be formed on the exposed sixth conductive pattern 19b. The connection terminals 25 may be in contact with the concavo-convex top surface of the sixth conductive pattern 19b. If the connection terminals 25 are gold balls or solder balls, then they may be attached on the exposed sixth conductive pattern 19b. If the connection terminals 25 are bumps, then they may be formed using a plating process. Due to the concavo-convex top surface of the sixth conductive pattern 19b, the sixth conductive pattern 19b can be connected to the connection terminals 25 with an increased contact area and an increased attaching strength.

Figure 10:
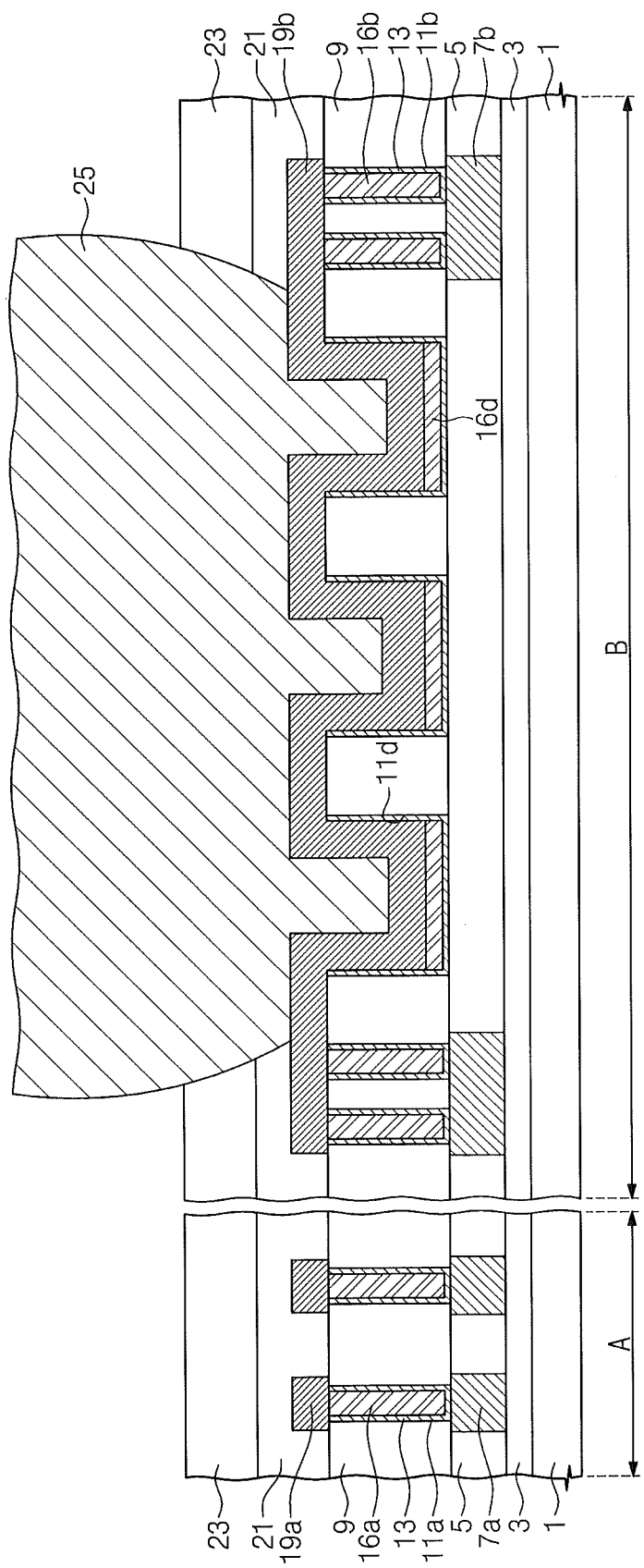
FIG. 10 is a sectional view illustrating a semiconductor device according to some embodiments.

FIG. 10 is a sectional view illustrating a semiconductor device according to some embodiments. Referring to FIG. 10, according to some embodiments, a semiconductor device may include third, fourth, and dummy conductive patterns 16a, 16b, and 16d, which may be in contact with the diffusion barrier layer 13 in the recess regions 11a, 11b, and 11d, respectively, without the seed layer 15. In addition, a sixth conductive pattern 19b may be in contact with the diffusion barrier layer 13 in the dummy recess region 11d. Except for these features, the semiconductor device in FIG. 10 may be configured to have the same technical features as the semiconductor device described with reference to FIG. 1.

Figure 11:
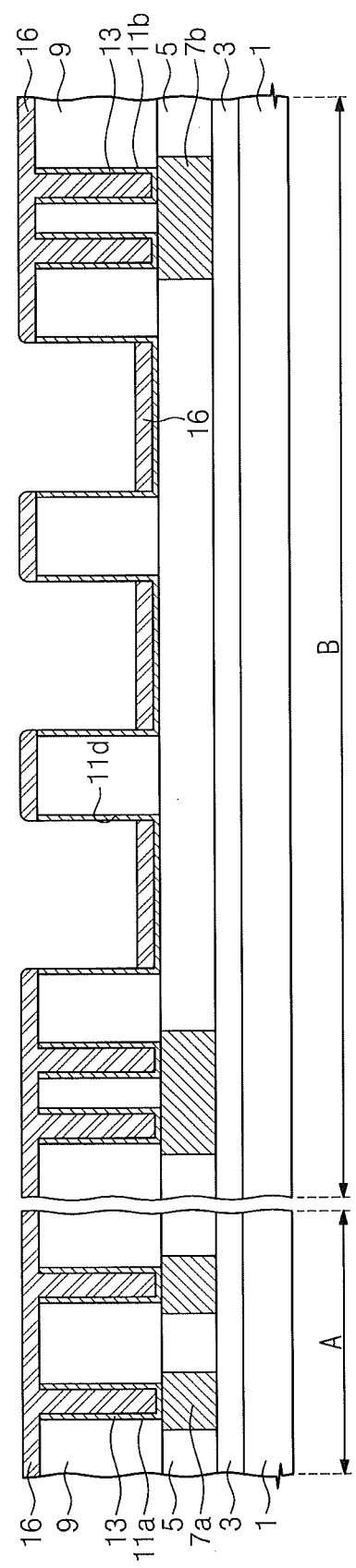
FIG. 11 is a sectional view illustrating a process of fabricating the semiconductor device of FIG. 10.

Referring to FIG. 11, a process of fabricating the semiconductor device of FIG. 10 is illustrated. If the thermal treatment described with reference to FIG. 6 is performed with an increased process time or at a higher process temperature, then the seed layer 15 may be completely melted and reflowed toward the bottom of the dummy recess region 11d. Further, if the seed layer 15 is a single layer of copper, and the conductive layer 17 is a copper layer at an initial stage of its deposition, a resulting conductive layer 16 after the reflow process may also be a copper layer. Alternatively, if the seed layer 15 is a double layer including copper and another metal (e.g., copper/aluminum or copper/manganese), then the copper layer may be selectively reflowed without a reflowing of the other metal layer. In such a case, the resulting structure may have the structural feature(s) depicted in FIG. 6. In other examples, even if the seed layer 15 includes other metals than copper, all metal elements in the seed layer 15 may be melted during the thermal treatment and may be mixed with the deposited conductive layer 17. Accordingly, the resulting conductive layer 16 after the reflow process may be a layer including copper and another metal. Thereafter, the process steps described with reference to FIGS. 7 to 9 may be performed to form a final structure depicted in FIG. 10.

Figure 12:
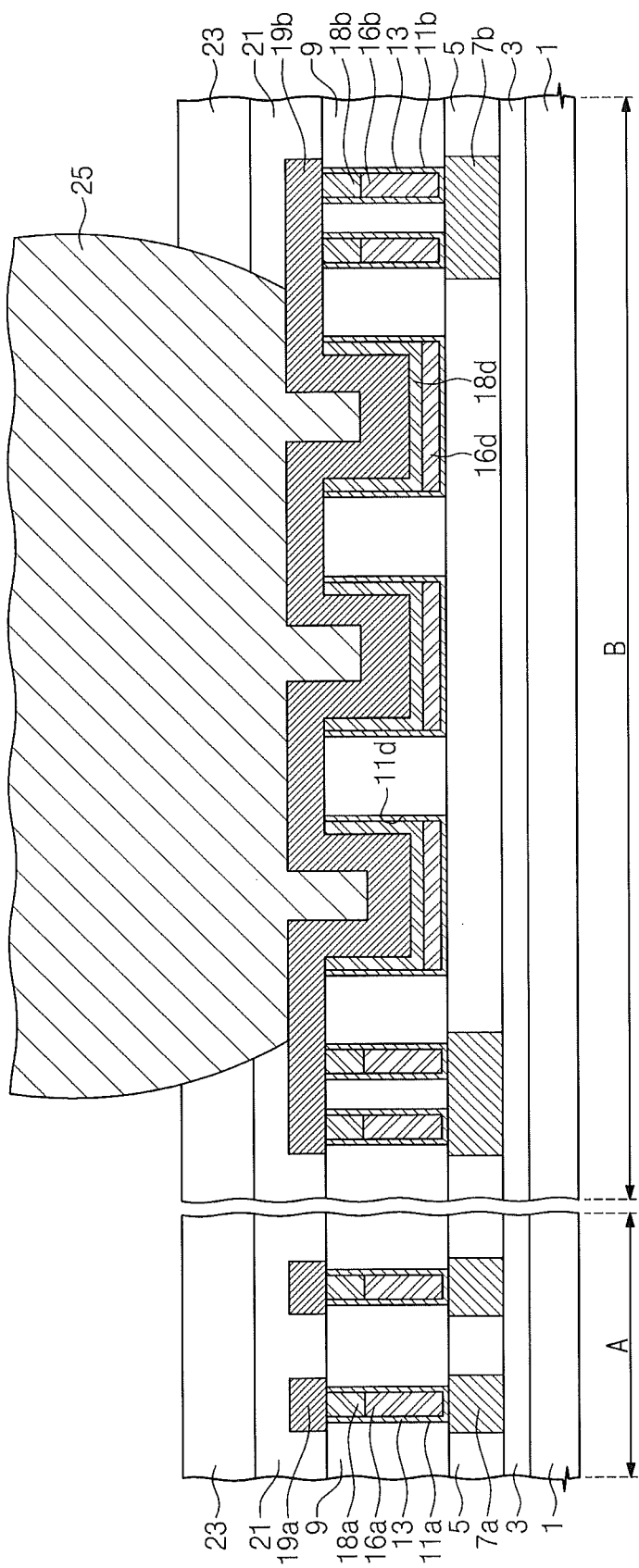
FIG. 12 is a sectional view illustrating a semiconductor device according to some embodiments.

FIG. 12 is a sectional view illustrating a semiconductor device according to some embodiments. Referring to FIG. 12, according to some embodiments, a semiconductor device may be configured in a similar manner to that of FIG. 10, but the third and fourth conductive patterns 16a and 16b thereof may be formed to partially fill the first and second recess regions 11a and 11b, respectively. A first supplementary pattern 18a may be provided on the third conductive pattern 16a to fill the remaining space of the first recess region 11a, and a second supplementary pattern 18b may be provided on the fourth conductive pattern 16b to fill the remaining space of the second recess region 11b. A dummy supplementary pattern 18d may be provided on the dummy conductive pattern 16d in the dummy recess region 11d. The supplementary patterns 18a, 18b, and 18d may be formed of the same material (e.g., at least one of copper, tungsten, or aluminum). The dummy supplementary pattern 18d may be formed to cover side and bottom surfaces of the dummy recess region 11d with a uniform thickness. The sixth conductive pattern 19b may be in contact with the dummy supplementary pattern 18d in the dummy recess region 11d. Aside from these features, the semiconductor device of FIG. 12 may be configured to have the same technical features as the semiconductor device described with reference to FIG. 10.

Figure 13:
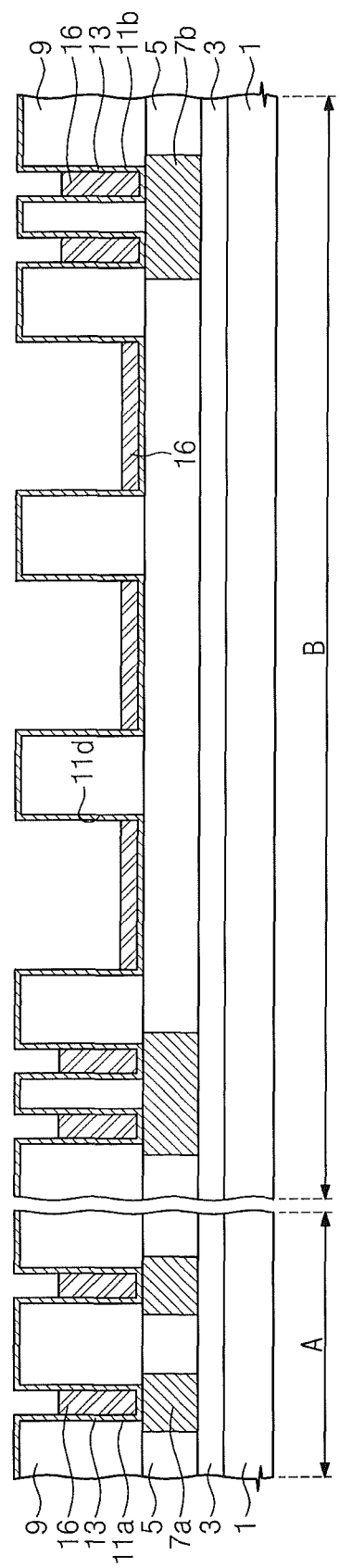
FIGS. 13 and 14 are sectional views illustrating a process of fabricating the semiconductor device of FIG. 12.
Figure 14:
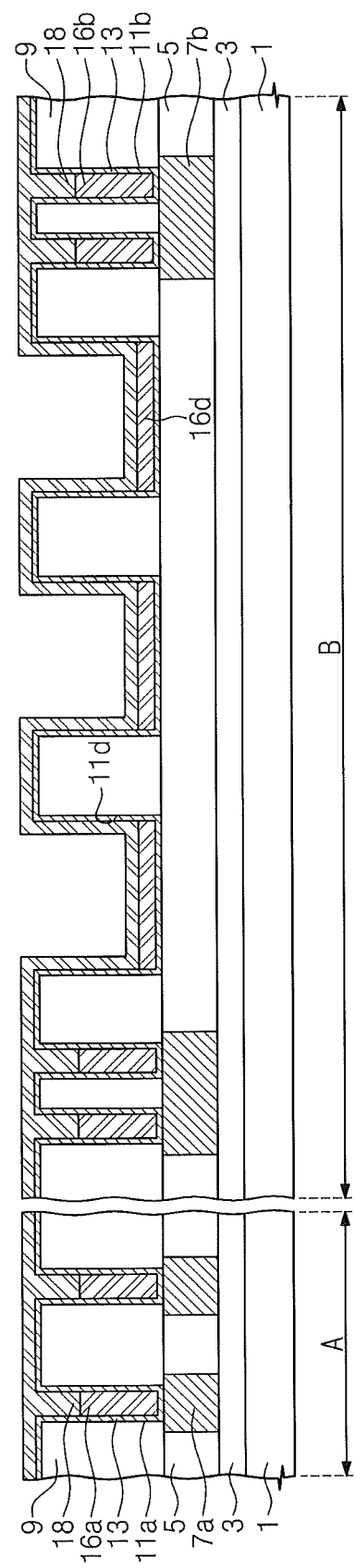

FIGS. 13 and 14 are sectional views illustrating a process of fabricating the semiconductor device of FIG. 12. Referring to FIG. 13, the PVD or sputtering process described with reference to FIG. 6 may be performed in such a way that the conductive layer 17 partially fills the first and second recess regions 11a and 11b. Thereafter, a thermal treatment may be performed to reflow both of the conductive layer 17 and the seed layer 15, and then, the resulting structure may have the structural feature(s) depicted in FIG. 13. All portions of the conductive layer 17 and the seed layer 15 located on the third insulating layer 9 may be reflowed into the recess regions 11a, 11b, and 11d, respectively, thereby exposing the diffusion barrier layer 13.

Referring to FIG. 14, a supplementary conductive layer 18 may be conformally deposited to fill the first and second recess regions 11a and 11b and to conformally cover side and bottom surfaces of the dummy recess region 11d. Thereafter, the process steps described with reference to FIGS. 7 to 9 may be performed to form the final structure depicted in FIG. 12.

Figure 15:
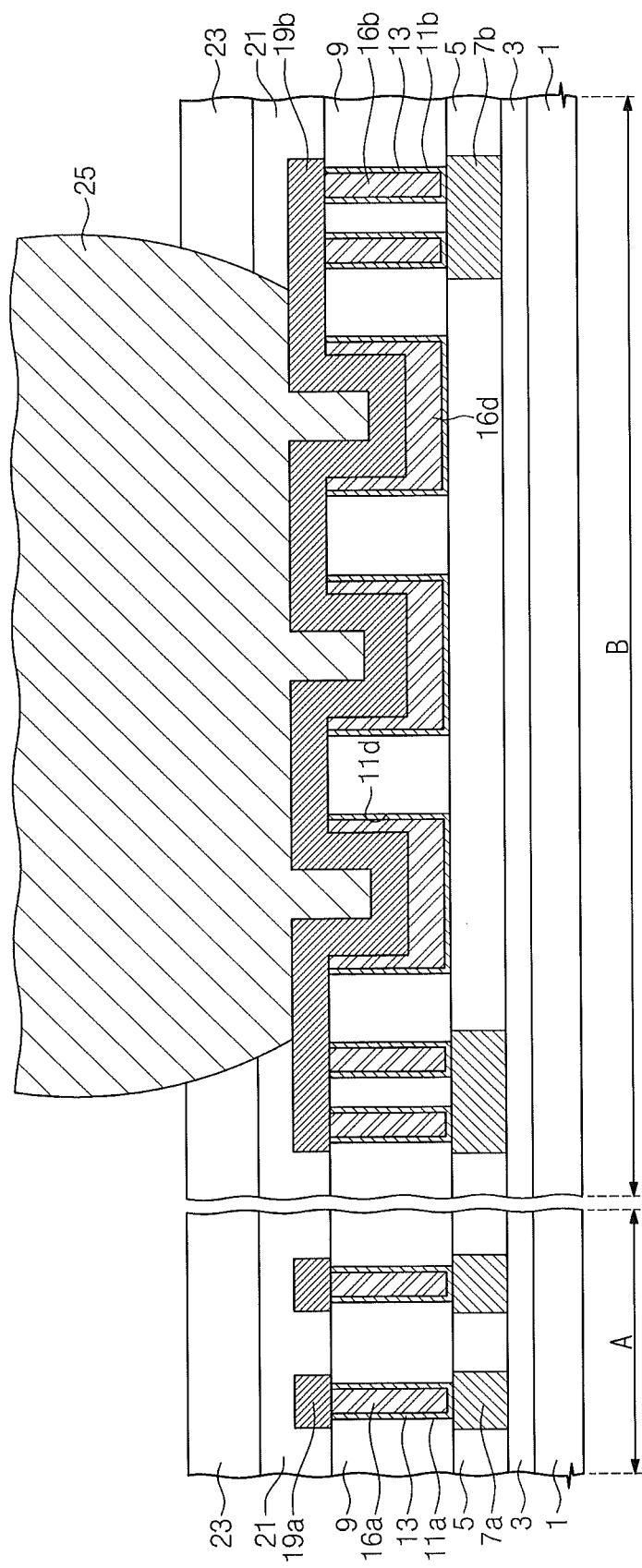
FIG. 15 is a sectional view illustrating a semiconductor device according to some embodiments.

FIG. 15 is a sectional view illustrating a semiconductor device according to some embodiments. Referring to FIG. 15, according to some embodiments, a semiconductor device may be configured in a similar manner to that of FIG. 10, but a portion of the dummy conductive pattern 16d thereof may extend along a sidewall of the dummy recess region 11d and may be interposed between the diffusion barrier layer 13 and the sixth conductive pattern 19b. In some embodiments, the dummy conductive pattern 16d may be formed to be thinner on a side surface of the dummy recess region 11d than on a bottom surface of the dummy recess region 11d. Except for these features, the semiconductor device of FIG. 15 may be configured to have the same technical features as the semiconductor device described with reference to FIG. 10.

Figure 16:
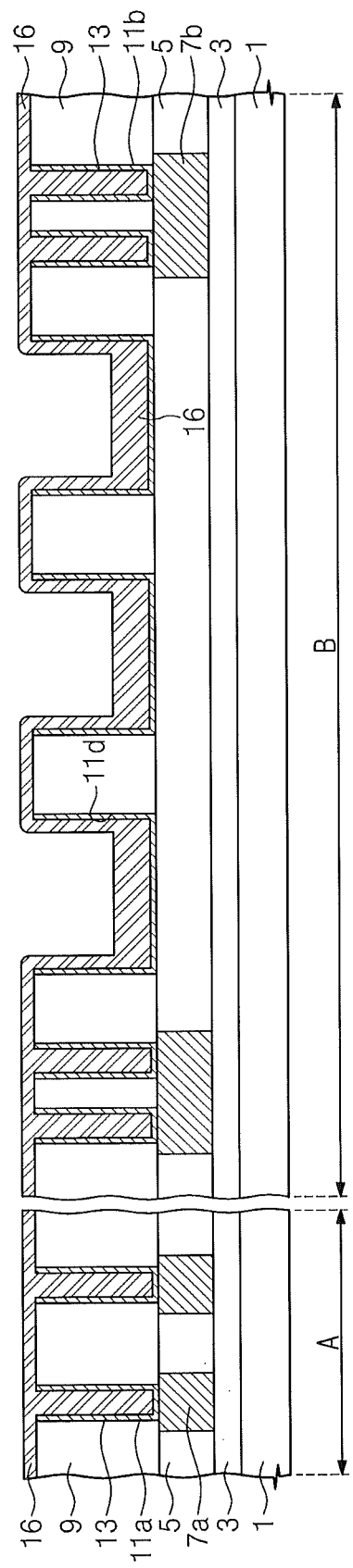
FIG. 16 is a sectional view illustrating a process of fabricating the semiconductor device of FIG. 15.

FIG. 16 is a sectional view illustrating a process of fabricating the semiconductor device of FIG. 15. Referring to FIG. 16, the thermal treatment on the structure of FIG. 6 may be performed in such a way that the reflowed conductive layer 16 may remain on the sidewall of the dummy recess region 11d with a finite thickness. Thereafter, the process steps described with reference to FIGS. 7 to 9 may be performed to form a final structure depicted in FIG. 15.

Figure 17:
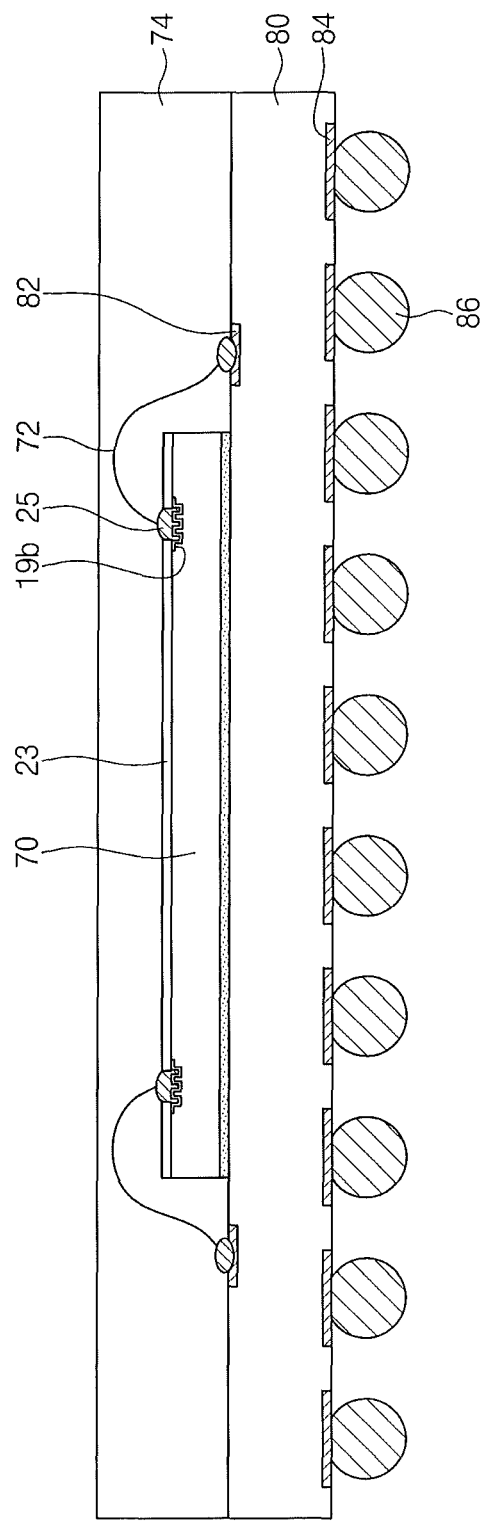
FIG. 17 is a sectional view of a semiconductor package according to some embodiments.

FIG. 17 is a sectional view of a semiconductor package according to some embodiments. Referring to FIG. 17, according to some embodiments, a semiconductor package may include a semiconductor chip 70 mounted on a package substrate 80. The package substrate 80 may be a printed circuit board with a single-layer structure or a multi-layered structure. Upper and lower conductive patterns 82 and 84 may be provided on top and bottom surfaces of the package substrate 80. A solder ball 86 may be attached on the lower conductive pattern 84 of the package substrate 80. An internal structure of the semiconductor chip 70 may be configured as described regarding the semiconductor devices herein (e.g., the semiconductor devices in FIGS. 1, 10, 12, and 15). For example, the semiconductor chip 70 may be configured to include the sixth conductive pattern 19b, whose top surface has a concavo-convex structure. The external connection terminal (e.g., gold ball) 25 may be attached to the sixth conductive pattern 19b and may be connected to the upper conductive pattern 82 via a gold wire 72. A mold layer 74 may be provided to cover a top surface of the package substrate 80. Moreover, it will be understood that the semiconductor package techniques described herein may be applied to various kinds of semiconductor devices and package modules including the same.

Figure 18:
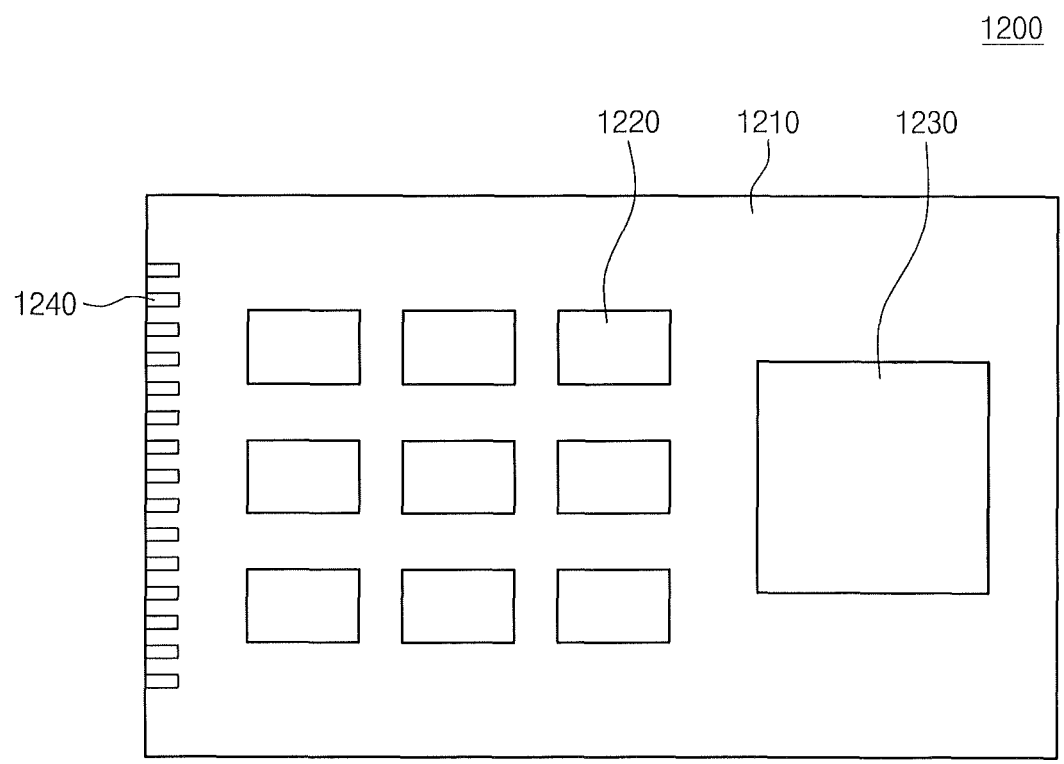
FIG. 18 is a view illustrating an example of a package module including a semiconductor package according to some embodiments.

FIG. 18 is a view illustrating an example of a package module including semiconductor packages according to some embodiments. Referring to FIG. 18, a package module 1200 may include semiconductor devices 1220 and a semiconductor device 1230 packaged in a quad flat package (QFP) type. The semiconductor devices 1220 and 1230 may correspond to semiconductor techniques according to some embodiments described herein and may be installed on a substrate 1210 to form the package module 1200. The package module 1200 may be connected to an external electronic device through an external connection terminal 1240 disposed at one side of the substrate 1210.

Figure 19:
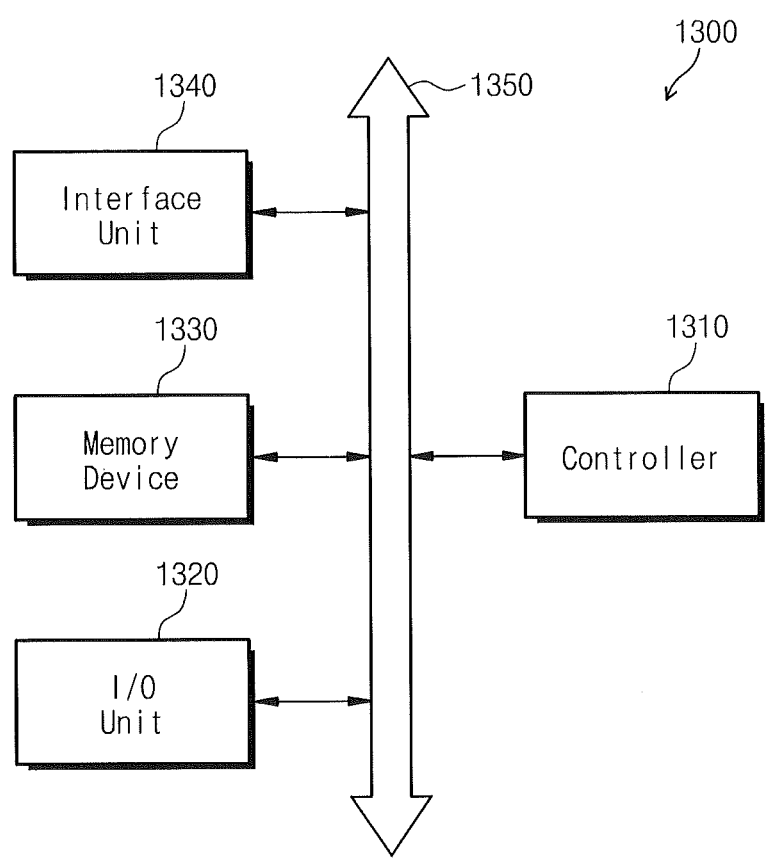
FIG. 19 is a schematic block diagram illustrating an example of an electronic system including a semiconductor package according to some embodiments.

The semiconductor package techniques described herein may be applied to an electronic system. FIG. 19 is a schematic block diagram illustrating an example of an electronic system including a semiconductor package according to some embodiments. Referring to FIG. 19, an electronic system 1300 may include a controller 1310, an input/output (I/O) unit 1320, and a memory device 1330. The controller 1310, the I/O unit 1320, and the memory device 1330 may be connected/combined with each other through a data bus 1350. The data bus 1350 may correspond to a path through which electrical signals are transmitted. The controller 1310 may include at least one of a microprocessor, a digital signal processor, a microcontroller, or another logic device. The other logic device may function similarly to any one of the microprocessor, the digital signal processor, and the microcontroller. The I/O unit 1320 may include a keypad, a keyboard, and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as a solid state disk (SSD) device. Accordingly, the electronic system 1300 may stably store mass data to the flash memory system. The electronic system 1300 may further include an interface unit 1340 that may transmit electrical data to a communication network or receive electrical data from a communication network. The interface unit 1340 may operate wirelessly or by wire/cable. For example, the interface unit 1340 may include an antenna for wireless communication or a transceiver for cable communication. An application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communications, the electronic system 1300 may be used in a communication interface protocol of a communication system such as Code Division Multiple Access (CDMA), Global System for Mobile Communications (GSM), North American Digital Cellular (NADC), Extended Time Division Multiple Access (E-TDMA), Wideband CDMA (WCDMA), CDMA2000, Wi-Fi, Muni Wi-Fi, Bluetooth, Digital Enhanced Cordless Telecommunications (DECT), Wireless Universal Serial Bus (USB), Flash-Orthogonal Frequency Division Multiplexing (Flash-OFDM), IEEE 802.20, General Packet Radio Service (GPRS), iBurst, WiBro, WiMAX, WiMAX-Advanced, UMTS-TDD, High Speed Packet Access (HSPA), Evolution Data Optimized (EVDO), Long Term Evolution (LTE)-Advanced, Multichannel Multipoint Distribution Service (MMDS), and so forth.

Figure 20:
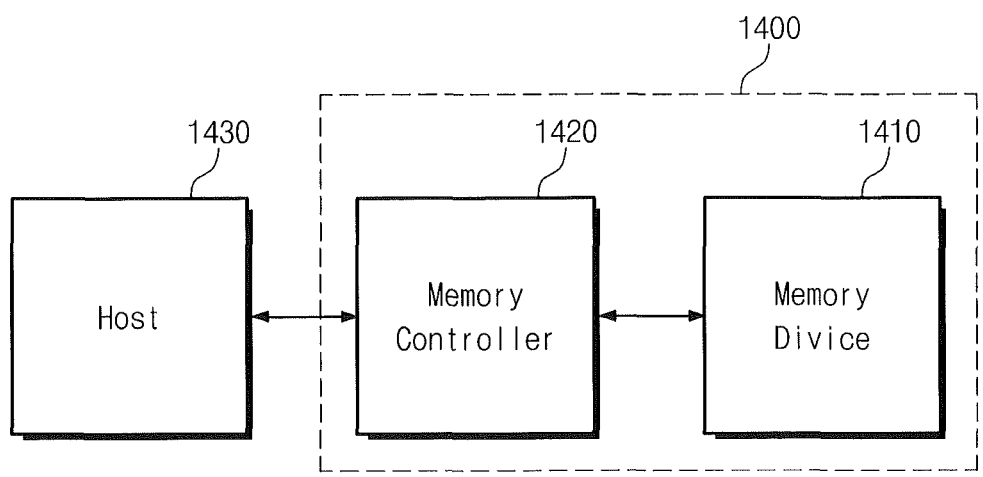
FIG. 20 is a schematic block diagram illustrating an example of a memory system including a semiconductor package according to some embodiments.

The semiconductor package techniques described herein may be applied to a memory system. FIG. 20 is a schematic block diagram illustrating an example of a memory system including a semiconductor package according to some embodiments. Referring to FIG. 20, a memory system 1400 may include a non-volatile memory device 1410 and a memory controller 1420. The non-volatile memory device 1410 and the memory controller 1420 may store data or may read stored data. The non-volatile memory device 1410 may include at least one non-volatile memory device applied with the semiconductor package techniques according to some embodiments described herein. The memory controller 1420 may control the non-volatile memory device 1410 to read the stored data and/or to store data in response to a read/write request of a host 1430.

According to some embodiments described herein, a semiconductor device may include conductive patterns, which may be connected to connection terminals and may have a concavo-convex top surface. Accordingly, top surfaces of the conductive patterns can have an increased contact area. It may therefore be possible to improve the attaching strength between the connection terminals and the conductive patterns.

According to some embodiments, during a process of fabricating a semiconductor device, conductive pads may be formed using a reflow process. This may enable a reduction of a thickness of a conductive layer provided on an insulating layer, in a planarization etching process. Accordingly, it may be possible to reduce a time required to perform the planarization etching process or to reduce an overall process time.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a substrate comprising first and second regions;
   an insulating layer on the substrate;
   first and second conductive patterns on the insulating layer, and on respective ones of the first and second regions;
   a dummy conductive pattern between the second conductive pattern and the substrate and insulated from the substrate; and
   a connection terminal on the second conductive pattern,
   wherein the first conductive pattern comprises a substantially planar top surface, and
   wherein the second conductive pattern comprises a non-planar top surface contacting the connection terminal at a plurality of different heights, the second conductive pattern comprising a plurality of pairs of opposing sidewalls contacting the connection terminal.

2. The device of claim 1, further comprising:
   first and second recess regions in the insulating layer on the first and second regions, respectively; and
   third and fourth conductive patterns in the first and second recess regions, respectively, and configured to be electrically connected to the first and second conductive patterns, respectively.

3. The device of claim 2, further comprising a diffusion barrier layer in the second recess region and between the fourth conductive pattern and the insulating layer,
   wherein the fourth conductive pattern comprises a top surface that is lower than a top surface of the insulating layer, and
   wherein the diffusion barrier layer extends along a sidewall of the second recess region and contacts the second conductive pattern in the second recess region.

4. The device of claim 2, further comprising:
   a diffusion barrier layer between the dummy conductive pattern and the insulating layer; and
   a seed layer between the diffusion barrier layer and the dummy conductive pattern, wherein the dummy conductive pattern comprises a top surface that is lower than a top surface of the insulating layer, and wherein the seed layer contacts the second conductive pattern.

5. The device of claim 2, wherein:

the dummy conductive pattern comprises portions on side and bottom surfaces of a third recess region, and the dummy conductive pattern comprises a first thickness on the bottom surface of the third recess region that is thicker than a second thickness on the side surface of the third recess region.

6. The device of claim 2, wherein:

the third and fourth conductive patterns comprise respective top surfaces that are lower than a top surface of the insulating layer, and the device further comprises:

a fifth conductive pattern in the first recess region and between the first and third conductive patterns; and a sixth conductive pattern in the second recess region and between and contacting the second and fourth conductive patterns.

7. The device of claim 6, wherein the sixth conductive pattern comprises portions conformally on side and bottom surfaces of the second recess region.

8. The device of claim 2, wherein the dummy conductive pattern is in a third recess region comprising a first width that is wider than a second width of the first recess region.

9. The device of claim 1, wherein the second conductive pattern comprises a bonding pad.

10. A semiconductor device, comprising:

a substrate;

an insulating layer on the substrate, the insulating layer comprising a plurality of recesses therein;

a non-planar conductive pattern comprising a first portion on the insulating layer and a second portion in each of the plurality of recesses;

a dummy conductive pattern in each of the plurality of recesses, between the second portion of the non-planar conductive pattern and the substrate, and insulated from the substrate; and a connection terminal comprising first and second portions on respective ones of the first and second portions of the non-planar conductive pattern.

11. The device of claim 10, wherein:

the first portion of the connection terminal contacts the first portion of the non-planar conductive pattern at a first height; and the second portion of the connection terminal contacts the second portion of the non-planar conductive pattern at a second height that is different from the first height.

12. The device of claim 11, wherein the second portion of the connection terminal contacts the second portion of the non-planar conductive pattern in the plurality of recesses of the insulating layer.

13. The device of claim 10, wherein:

the substrate comprises first and second regions;

the non-planar conductive pattern is on the second region; and the device further comprises a substantially planar conductive pattern on the first region.

14. The device of claim 1, wherein the non-planar top surface of the second conductive pattern comprises a shape that repeatedly alternates from peak to trough.

15. The device of claim 10, wherein the non-planar conductive pattern comprises a shape that repeatedly alternates from respective peaks on the insulating layer to respective troughs in the plurality of recesses.

16. The device of claim 1, further comprising a plurality of recesses in the insulating layer, wherein the plurality of pairs of opposing sidewalls of the second conductive pattern contact the connection terminal in respective ones of the plurality of recesses.

17. The device of claim 10, wherein the non-planar conductive pattern comprises a plurality of pairs of opposing sidewalls contacting the connection terminal in respective ones of the plurality of recesses.

18. A semiconductor device, comprising:

a substrate;

an insulating layer on the substrate, the insulating layer comprising a recess therein;

a non-planar conductive pattern comprising a first portion on the insulating layer and a second portion in the recess;

a connection terminal comprising first and second portions on respective ones of the first and second portions of the non-planar conductive pattern; and a dummy conductive pattern filling a bottom portion of the recess, wherein a bottom surface of the second portion of the non-planar conductive pattern is spaced apart from a bottom surface of the recess by the dummy conductive pattern therebetween, and wherein the dummy conductive pattern is insulated from the substrate.

19. The device of claim 18, further comprising a diffusion barrier layer in the recess and between the dummy conductive pattern and the insulating layer, wherein the diffusion barrier layer directly contacts the bottom surface of the recess.

* * * * *